United States Patent
Suzuki

(10) Patent No.: US 6,775,151 B2
(45) Date of Patent: Aug. 10, 2004

(54) STRUCTURE FOR MOUNTING AN ELECTRONIC CIRCUIT UNIT

(75) Inventor: Norio Suzuki, Fukushima-ken (JP)

(73) Assignee: Alps Electric Co., Ltd., Tokyo (JP)

( * ) Notice: Subject to any disclaimer, the term of this patent is extended or adjusted under 35 U.S.C. 154(b) by 0 days.

(21) Appl. No.: 10/310,297

(22) Filed: Dec. 5, 2002

(65) Prior Publication Data

US 2003/0107876 A1 Jun. 12, 2003

(30) Foreign Application Priority Data

Dec. 12, 2001 (JP) ........................................ 2001-378267

(51) Int. Cl.⁷ .............................................. H01R 12/16
(52) U.S. Cl. ..................... 361/788; 361/736; 361/752; 361/796; 361/803; 361/753; 361/759; 439/61
(58) Field of Search ................................. 361/803, 785, 361/796, 778, 752, 753, 801, 802, 736, 759; 439/61

(56) References Cited

U.S. PATENT DOCUMENTS

| | | | | |
|---|---|---|---|---|
| 5,159,537 A | * | 10/1992 | Okano | 361/816 |
| 5,907,478 A | * | 5/1999 | Watanabe | 361/807 |
| 6,388,892 B1 | * | 5/2002 | Maeda | 361/801 |
| 6,456,505 B1 | * | 9/2002 | Suzuki et al. | 361/803 |
| 6,551,117 B2 | * | 4/2003 | Poplawski et al. | 439/92 |

FOREIGN PATENT DOCUMENTS

JP        2001-111260        4/2001

* cited by examiner

Primary Examiner—Kamand Cuneo
Assistant Examiner—Thanh Y. Tran
(74) Attorney, Agent, or Firm—Brinks Hofer Gilson & Lione

(57) ABSTRACT

A circuit board is provided with extending portions having terminal patterns formed thereon. A housing contains the circuit board while permitting the extending portions to protrude. A mother board has, formed therein, through holes in which the extending portions are to be inserted, having, formed thereon, wiring pattern that is to be electrically connected to the terminal patterns, and permitting the extending portions to be inserted in the through holes so that the housing is placed thereon. The circuit board is provided with a protruded portion which extends separately from the extending portions and pushes the terminal patterns onto the wiring pattern of the mother board. The mother board is provided with an insertion hole in which the protruded portion is to be inserted being slightly deviated from the positions of the through holes in which the extending portions are to be inserted.

5 Claims, 8 Drawing Sheets

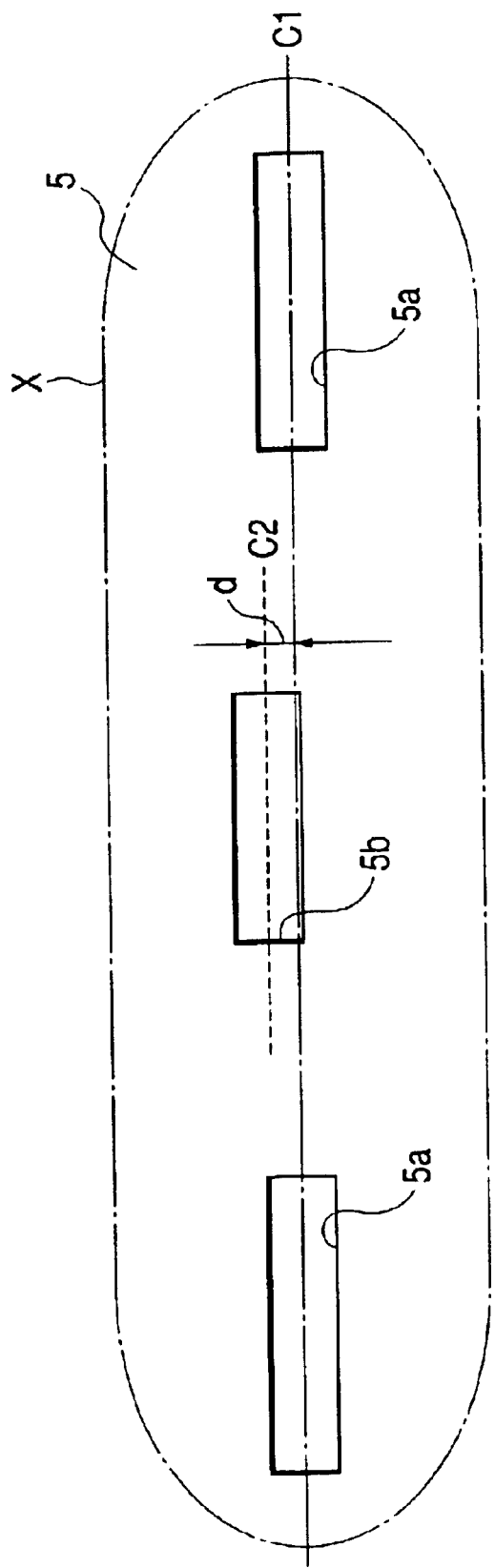

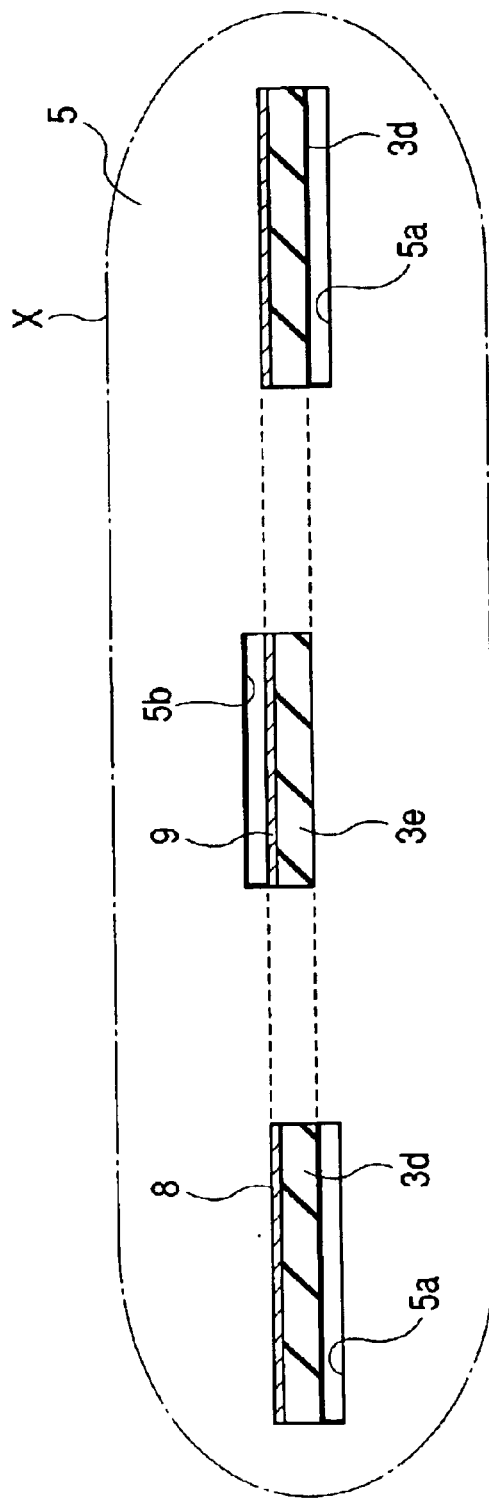

STRUCTURE FOR MOUNTING AN ELECTRONIC CIRCUIT UNIT

BACKGROUND OF THE INVENTION

1. Field of the Invention

This invention relates to a structure for mounting, on a mother board, an electronic circuit unit which has a circuit board contained in a housing. More particularly, the invention relates to a structure for mounting an electronic circuit unit enabling a wiring pattern on the circuit board to be reliably connected to a wiring pattern on the mother board without involving defective soldering.

2. Description of the Related Art

In an electronic circuit unit 50 such as the one of a television tuner as shown in FIG. 8, a circuit board 51 mounting an electronic part such as IC parts that is not shown has been contained in a box-shaped housing 52 with its both ends being opened, and these two open ends of the hosing 52 have been closed with covers 53.

FIG. 9 is a sectional view illustrating a state where the electronic circuit unit 50 is mounted on the mother board 54 along a line 9—9 in FIG. 8.

Referring to FIG. 8, the circuit board 51 has a pair of extending portions 51a extending from one end side. Referring to FIG. 9, on each extending portion 51a is formed a terminal pattern 51d drawn from the wiring pattern 51c that is formed on one surface 51b of the circuit board 51.

The housing 52 is provided with notches that are not shown, and the extending portions 51a of the circuit board 51 are allowed to protrude beyond the housing 52 through the notches. Further, pairs of mounting legs 52a are provided on both end surfaces of the housing 52.

The thus constituted electronic circuit unit 50 is used being mounted on the mother board 54 on the set side as described below. If closely described, the mother board 54 has, formed therein, through holes 54a and 54b in which the extending portions 51a of the circuit board 51 and the mounting legs 52a of the housing 52 will be inserted. In the through holes 54a and 54b are inserted the corresponding extending portions 51a of the circuit board 51 and the mounting legs 52a of the housing 52, and the electronic circuit unit 50 is mounted on the mother board 54.

Here, the terminal pattern 51d formed on the extending portion 51a is soldered with a jet solder that is not shown onto the wiring pattern 54d formed on the back surface 54c of the mother board 54.

According to the above conventional structure for mounting the electronic circuit unit 50, however, the through holes 54a are formed in a size which includes a margin and are, hence, formed in a size slightly larger than the size of the extending portions 51a in order to prevent the terminal patterns 51d from peeling off that results when the terminal patterns 51d formed on the extending portions 51a come in contact with the inner walls of the through holes 54a at the time when the extending portions 51a are inserted in the through holes 54a of the mother board 54.

In the conventional electronic circuit unit 50, therefore, the extending portions 51a are inserted in the through holes 54a in a loose state and become rickety without accomplishing precise positioning. As shown in FIG. 9, further, a gap develops between the terminal pattern 51d on the extending portion 51a and the wiring pattern 54d on the back surface 54c of the mother board 54 giving rise to the occurrence of defective soldering.

To cope with a gap that develops between the terminal pattern 51d on the extending portion 51a and the wiring pattern 54d on the mother board 54, it has also been attempted to incorporate in the production steps a step of pushing the circuit board 51 in a manner that the terminal pattern 51d comes into contact with the wiring pattern 54d resulting, however, in an increase in the number of the steps and causing the production steps to become complex.

SUMMARY OF THE INVENTION

This invention was proposed in view of the above conventional circumstances, and provides a structure for mounting an electronic circuit unit on a mother board highly precisely and easily without causing defective soldering.

Namely, this invention provides a structure for mounting an electronic circuit unit comprising:

a circuit board provided, on one end side thereof, with extending portions having first wiring patterns formed on the surfaces thereof;

a housing for containing the circuit board while permitting the extending portions to protrude outward; and a mother board having, formed therein, through holes in which the extending portions are to be inserted, having, formed thereon, a second wiring pattern that is to be electrically connected to the first wiring patterns, and permitting the extending portions to be inserted in the through holes so that the housing is placed thereon;

wherein the circuit board is provided with pushing means which extends separately from the extending portions on one end side, and pushes the first wiring patterns onto the second wiring pattern.

By the above constitution, according to the structure for mounting the electronic circuit unit of the invention, the first wiring pattern formed on the extending portion of the circuit board is pushed onto the second wiring pattern formed on the mother board by the pushing means, whereby the development of a gap between the first wiring pattern and the second wiring pattern is prevented. Therefore, the first wiring pattern and the second wiring pattern can be connected together without causing defective soldering, and the circuit board can be mounted onto the mother board with high precision.

Here, it is desired that the pushing means is a protruded portion extending on one end side of the circuit board, that an insertion hole in which the protruded portion is to be inserted is formed in the mother board and that by forcibly inserting the protruded portion in the insertion hole, the first wiring patterns on the extending portions are pushed onto the second wiring pattern.

With the protruded portion being forcibly inserted in the insertion hole formed in the mother board, the first wiring patterns on the extending portions are strongly pushed onto the second wiring pattern of the mother board, making it possible to reliably prevent the occurrence of a gap between the first wiring patterns and the second wiring pattern.

Here, it is desired that the circuit board is provided with at least a pair of extending portions on one end side thereof, a pair of through holes are formed in the mother board so as to be corresponded to the pair of extending portions, and the protruded portion is located midway between the pair of extending portions.

With the protruded portion being forcibly inserted in the insertion hole, therefore, the first wiring patterns on both extending portions arranged on both sides of the protruded portion can be pushed onto the second wiring pattern with a uniform pushing force.

It is further desired that the insertion hole in which the protruded portion is to be inserted is formed at a position deviated in a direction in which the first wiring patterns are pushed onto the second wiring patterns from the positions of the through holes in which the extending portions are to be inserted.

Since the protruded portion is inserted in such a manner that the first wiring patterns are strongly pushed onto the second wiring pattern, it is allowed to more reliably and strongly bring the first wiring patterns into contact with the second wiring pattern.

Here, it is further desired that the protruded portion is tapered on the surface of the side opposite to the surface of the side on where the first wiring patterns of the circuit board are pushed onto the second wiring pattern. This enables the protruded portion to be more easily inserted in the insertion hole.

BRIEF DESCRIPTION OF THE DRAWINGS

FIG. 4 is a plan view illustrating, on an enlarged scale, a range X of the mother board of FIG. 1;

FIG. 7 is a plan view illustrating a state where the extending portions and the protruded portion have been inserted in the first and second through holes in the structure for mounting the electronic circuit unit according to the embodiment of the invention;

DETAILED DESCRIPTION OF THE INVENTION

Figure 1:
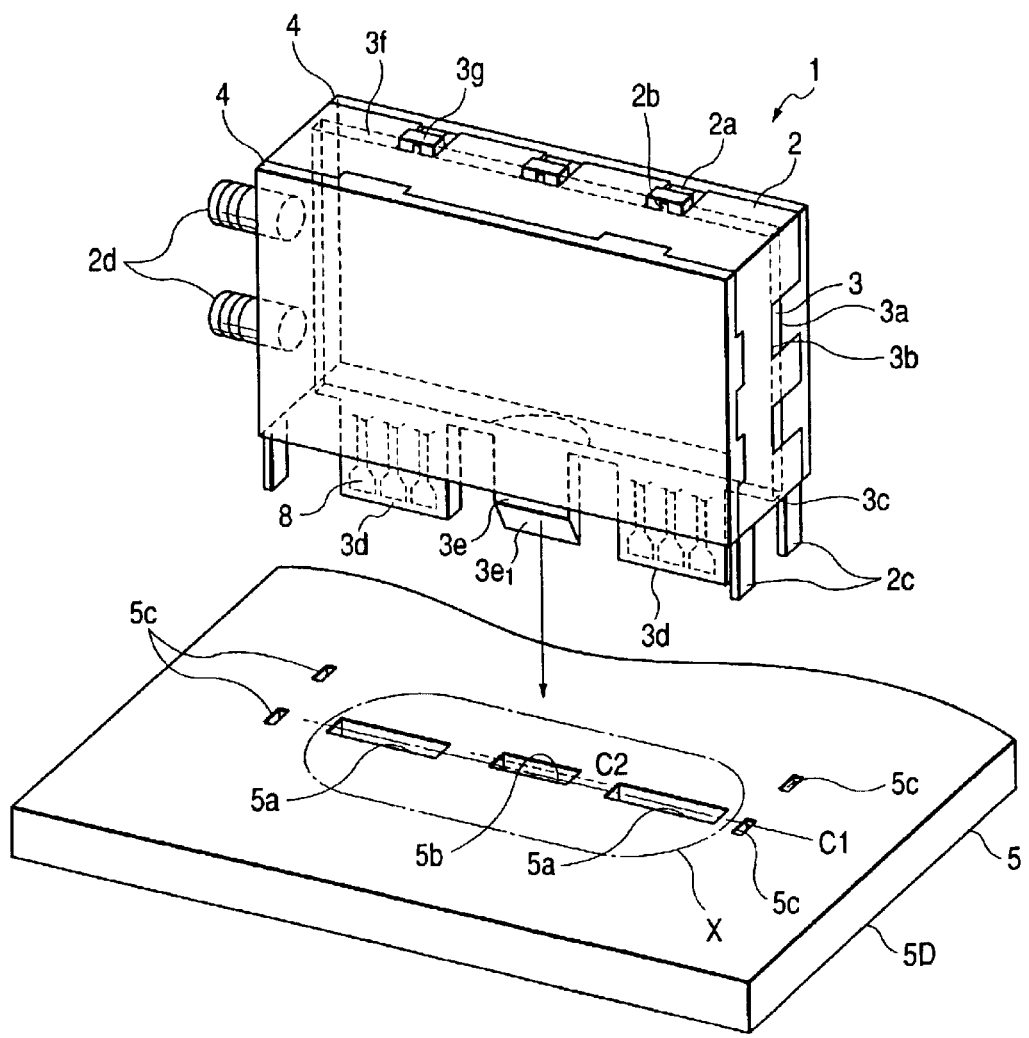
FIG. 1 is a perspective view illustrating a structure for mounting an electronic circuit unit according to an embodiment of the invention.

An embodiment of the invention will now be described in detail with reference to the drawings. FIG. 1 is a perspective view illustrating a structure for mounting an electronic circuit unit according to an embodiment of the invention, FIG. 2 is a plan view illustrating the surface of a circuit board in the electronic circuit unit according to the embodiment of the invention, and FIG. 3 is a plan view illustrating the back surface of the circuit board in the electronic circuit unit according to the embodiment of the invention.

The electronic circuit unit 1 according to this embodiment is preferably used, for example, as a television tuner incorporated in a television receiver.

In the electronic circuit unit 1 as shown in FIG. 1, a circuit board 3 is contained in a box-shaped housing 2 with its both ends being opened, and these two open ends of the housing 2 are closed with covers 4. The electronic circuit unit 1 is such that the housing 2 containing the circuit board 3 is placed on a mother board 5 on the set side and is thus mounted on the mother board 5.

Figure 2:
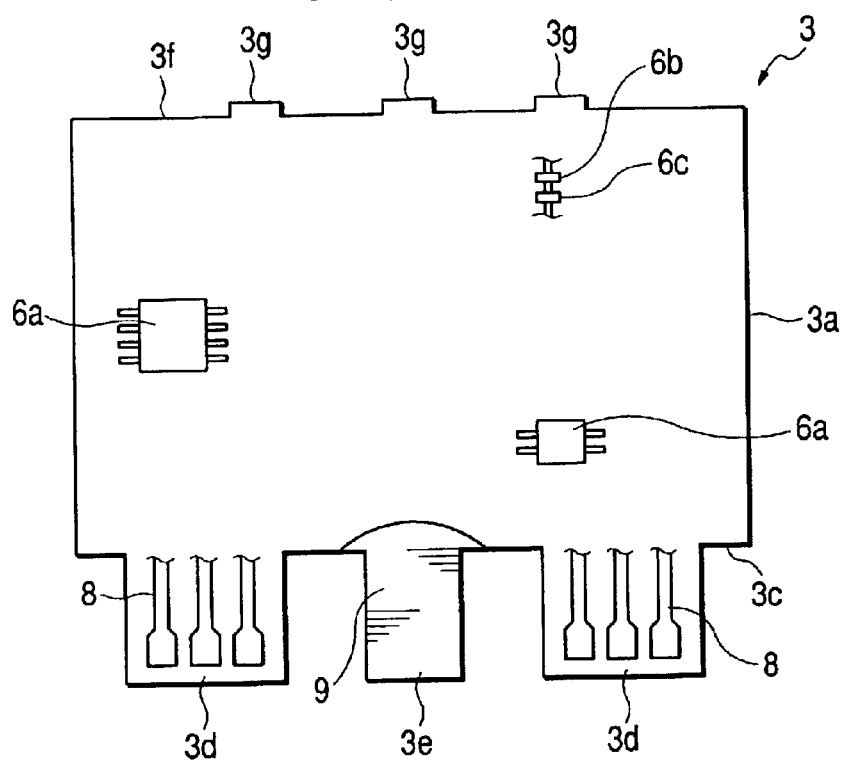
FIG. 2 is a plan view illustrating the surface of a circuit board in the electronic circuit unit according to the embodiment of the invention.
Figure 3:
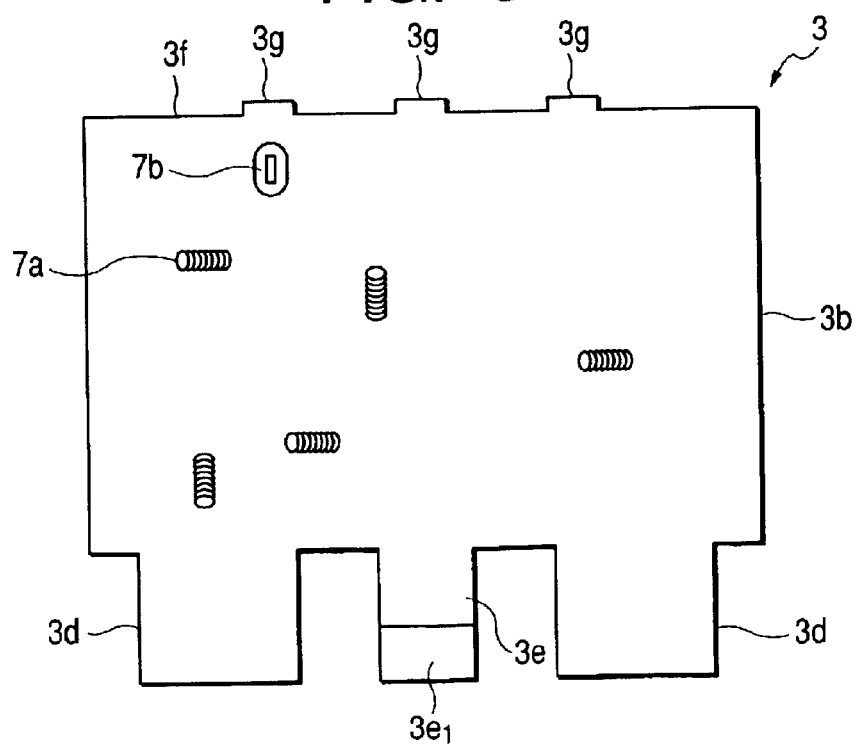
FIG. 3 is a plan view illustrating the back surface of the circuit board in the electronic circuit unit according to the embodiment of the invention.

The circuit board 3 has a wiring pattern, that is not shown, formed on the surface 3a thereof, and is mounting such electronic parts as IC chips 6a, chip resistors 6b, chip capacitors 6c and the like parts through the wiring pattern as shown in FIG. 2.

Referring to FIG. 3, the circuit board 3 is further mounting, on the back surface 3b thereof, such discrete parts as coils 7a and transformers 7b.

In this embodiment as shown in FIGS. 1 to 3, in particular, the circuit board 3 is provided, on its one end side 3c, with a pair of extending portions 3d which are in parallel with each other and with a protruded portion 3e located midway between the pair of extending portions 3d integrally on the part-mounting region of the circuit board 3. When the circuit board 3 is contained in the housing 2, the extending portions 3d and the protruded portion 3e protrude beyond the housing 2.

Here, the extending portions 3d and the protruded portion 3e are formed integrally with the circuit board 3, and are formed in a single piece. Therefore, the extending portions 3d move following the insertion operation of the protruded portion 3e.

The extending portions 3d and the protruded portion 3e may be formed separately from each other but must be in flush.

In this embodiment, further, the extending portions 3d are formed in a pair and the protruded portion 3e is formed at one place. The invention, however, is not limited thereto only, and the extending portions 3d and the protruded portion 3e may be provided at the end on the same side of the circuit board 3 and, besides, there is no limitation on their numbers.

Referring to FIG. 2, terminal patterns 8 are formed on the extending portions 3d on the side of the front surface 3a of the circuit board 3, the terminal patterns 8 being drawn from the wiring pattern formed on the front surface 3a of the circuit board.

Referring to FIG. 2, an electrically conducting layer 9 which serves as a grounding conductor is formed on the protruded portion 3e on the side of the front surface 3a of the circuit board 3. As shown in FIGS. 1 and 3, the protruded portion 3e is partly tapered as designated at 3e1 on the side of the back surface 3b of the circuit board 3. The circuit board 3 is further provided with mounting protrusions 3g at three places on the other end side 3f for mounting on the housing 2.

In this embodiment, the electrically conducting layer 9 serving, for example, as the grounding conductor is formed on the protruded portion 3e. The invention, however, is in no way limited thereto only, and none of the functional film or pattern may be formed on the protruded portion 3e.

In this embodiment, further, one surface of the protruded portion 3e is tapered as designated at 3e1. Not being limited thereto only, however, the tapered surface may not be tapered but may be flat. With the protruded portion 3e being tapered as designated at 3e1 as in this embodiment, however, it is allowed to smoothly insert the protruded portion 3e in the through hole that will be described later and that is formed in the mother board 5.

The housing 2 works to shield the circuit board 3 on which the electronic parts are mounted from the external undesired signals, and to shield signals and noises generated by the circuit board 3 from being transmitted to the external circuits.

The housing 2 is provided with substrate-mounting portions 2b corresponding to the mounting projections 3g of the circuit board 3 for soldering, as designated at 2a, the mounting projections 3g to the housing 2 penetrating through the mounting projections 3g. The circuit board 3 is held by the housing 2 through the substrate-mounting portions 2b.

Further, notches (not shown) are formed in the lower side surface of the housing 2 at positions corresponding to the extending portions 3d and the protruded portion 3e of the circuit board 3. The extending portions 3d and the protruded portion 3e are fitted into the notches and are permitted to protrude beyond the housing 2 while the circuit board 3 is being held by the housing 2.

Pairs of mounting legs 2c are provided on both opposing side surfaces of the housing 2 so as to work as support members for mounting on the mother board 5. A pair of connectors 2d are provided on the side surface of either one of the two side surfaces of the housing 2 for connection to a cable of an external receiver unit such as television or the like.

FIG. 4 is a plan view illustrating, on an enlarged scale, a range X of the mother board 5 of FIG. 1.

As shown in FIGS. 1 and 4, in the mother board 5 are formed a pair of first through holes 5a in which will be inserted the pair of extending portions 3d of the circuit board 3, and a second through hole 5b which is located midway between the pair of first through holes 5a and in which will be inserted the protruded portion 3e. Here, the first through holes 5a and the second through hole 5b are of sizes having some margin so that the extending portions 3d and the protruded portion 3e can be easily inserted therein.

In the mother board 5 are further formed third through holes 5c as shown in FIG. 1, so that the mounting legs 2c of the housing 2 can be inserted therein.

Figure 5A:
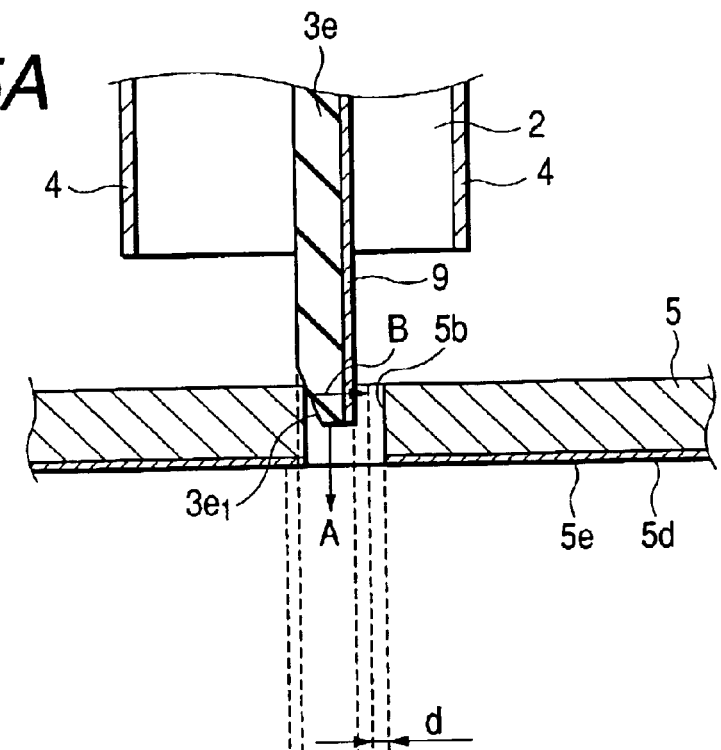
FIG. 5 is a sectional view illustrating a state where a protruded portion and extending portions of the circuit board are to be inserted in the first and second through holes of a mother board in the structure for mounting the electronic circuit unit according to the embodiment of the invention, as viewed from a direction perpendicular to the surface of the board.
Figure 5B:
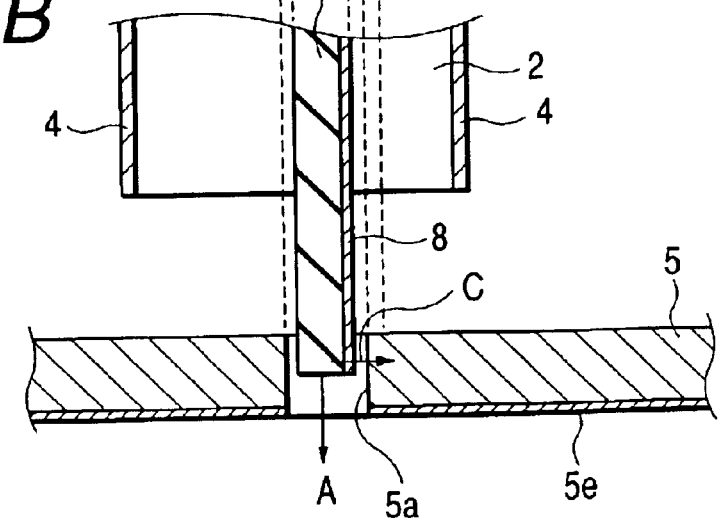

FIG. 5A is a sectional view illustrating a state where the protruded portion 3e of the circuit board 3 is to be inserted in second through hole 5b of the mother board 5, as viewed from a direction perpendicular to the surfaces 3a and 3b of the board, and FIG. 5B is a sectional view illustrating a state where the extending portions 3d of the circuit board 3 are to be inserted in first through holes 5a of the mother board 5, as viewed from the direction perpendicular to the surfaces 3a and 3b of the board.

Referring to FIG. 5, on the back surface 5d of the mother board 5 is formed a wiring pattern 5e that is electrically connected to the terminal patterns 8 on the extending portions 3d of the circuit board 3.

In this embodiment as shown in FIG. 1, in particular, the second through hole 5b is formed at a position which is deviated, from the positions of the first through holes 5a, in a direction in which the terminal patterns 8 on the extending portions 3d are pushed onto the wiring pattern 5e on the mother board 5.

More closely, as shown in FIG. 4, the first through holes 5a and the second through hole 5b are so arranged that a center line C1 of the first through holes 5a in the lengthwise direction thereof is deviated by a distance d from a center line C2 of the second through hole 5b in the lengthwise direction thereof.

In the electronic circuit unit 1 as described above, the circuit board 3 is provided with the protruded portion 3e in addition to the extending portions 3d, the extending portions 3d and the protruded portion 3e being formed of a piece of board, and the position of the second through hole 5b in which the protruded portion 3e is to be inserted is deviated from the positions of the first through holes 5a in which the extending portions 3d are to be inserted. According to the electronic circuit unit 1 of this embodiment, therefore, the protruded portion 3e is inserted in the second through hole 5b in a manner to strongly push the terminal patterns 8 onto the wiring pattern 5e; i.e., the protruded portion 3e so pushes the extending portions 3d that the terminal patterns 8 are brought into contact with the wiring pattern 5e.

In this embodiment, the extending portions 3d and the protruded portion 3e are formed of a piece of board. Not being limited thereto only, however, the extending portions 3d and the protruded portion 3e may be separately formed but must be in flush with each other. With the extending portions 3d and the protruded portion 3e being formed of a piece of board, or with the extending portions 3d and the protruded portion 3e being at least in flush, the protruded portion 3e works to push the extending portions 3d as described above when the extending portions 3d and the protruded portion 3e are inserted in the first and second through holes 5a and 5b of which the positions are deviated.

In this embodiment, the protruded portion 3e is positioned midway between the pair of extending portions 3d. Not being limited thereto only, however, the protruded portion 3e may be formed on the same end side as the extending portions 3d on the circuit board 3. With the protruded portion 3e being positioned midway between the pair of extending portions 3d as in this embodiment, it is made possible to push the terminal patterns 8 on the extending portions 3d arranged on both sides of the protruded portion 3e onto the wiring pattern 5e on the mother board 5 with a uniform pushing force.

Closely speaking, the electronic circuit unit 1 of this embodiment constituted as described above is mounted on the mother board 5 in a manner as described below.

First, the housing 2 containing and holding the circuit board 3 is moved in a direction A in FIG. 5 to insert the protruded portion 3e of the circuit board 3 in the second through hole 5b as shown in FIG. 5A. Then, as shown in FIG. 5B, the extending portions 3d of the circuit board 3 are inserted in the first through holes 5a. At the same time, the mounting legs 2c of the housing 2, too, are inserted in the third through holes 5c.

At this moment as shown in FIG. 5A, the tapered surface 3e1 comes in contact with the wall of the second through hole 5b. Being guided along the tapered surface 3e1, therefore, the protruded portion 3e is smoothly inserted in the second through hole 5b.

At this moment, further, the protruded portion 3e receives a force in the direction B in FIG. 5A from the portion that is coming in contact with the wall of the second through hole 5b from the start of insertion until the completion of insertion. Being associated with the insertion of the protruded portion 3e, therefore, the extending portions 3d provided adjacent to the protruded portion 3e are pushed in a direction in which the terminal patterns 8 formed on the surfaces thereof are brought in contact with the wiring pattern 5e on the mother board 5, i.e., pushed in a direction C in FIG. 5B.

Figure 6A:
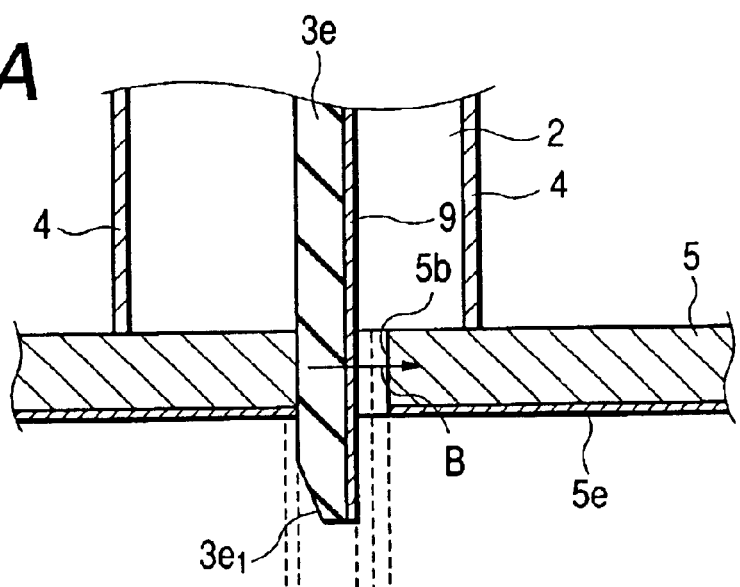
FIG. 6 is a sectional view illustrating a state where the protruded portion and extending portions have been inserted in the first and second through holes in the structure for mounting the electronic circuit unit according to the embodiment of the invention, as viewed from a direction perpendicular to the surface of the board.
Figure 6B:
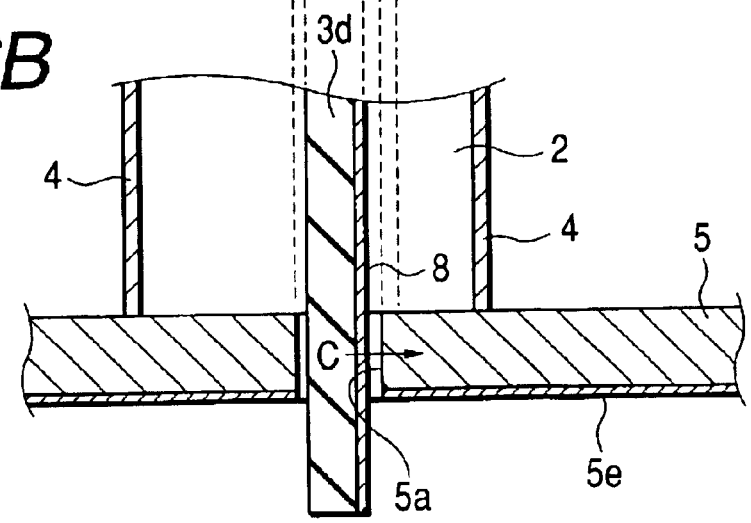
Figure 8:
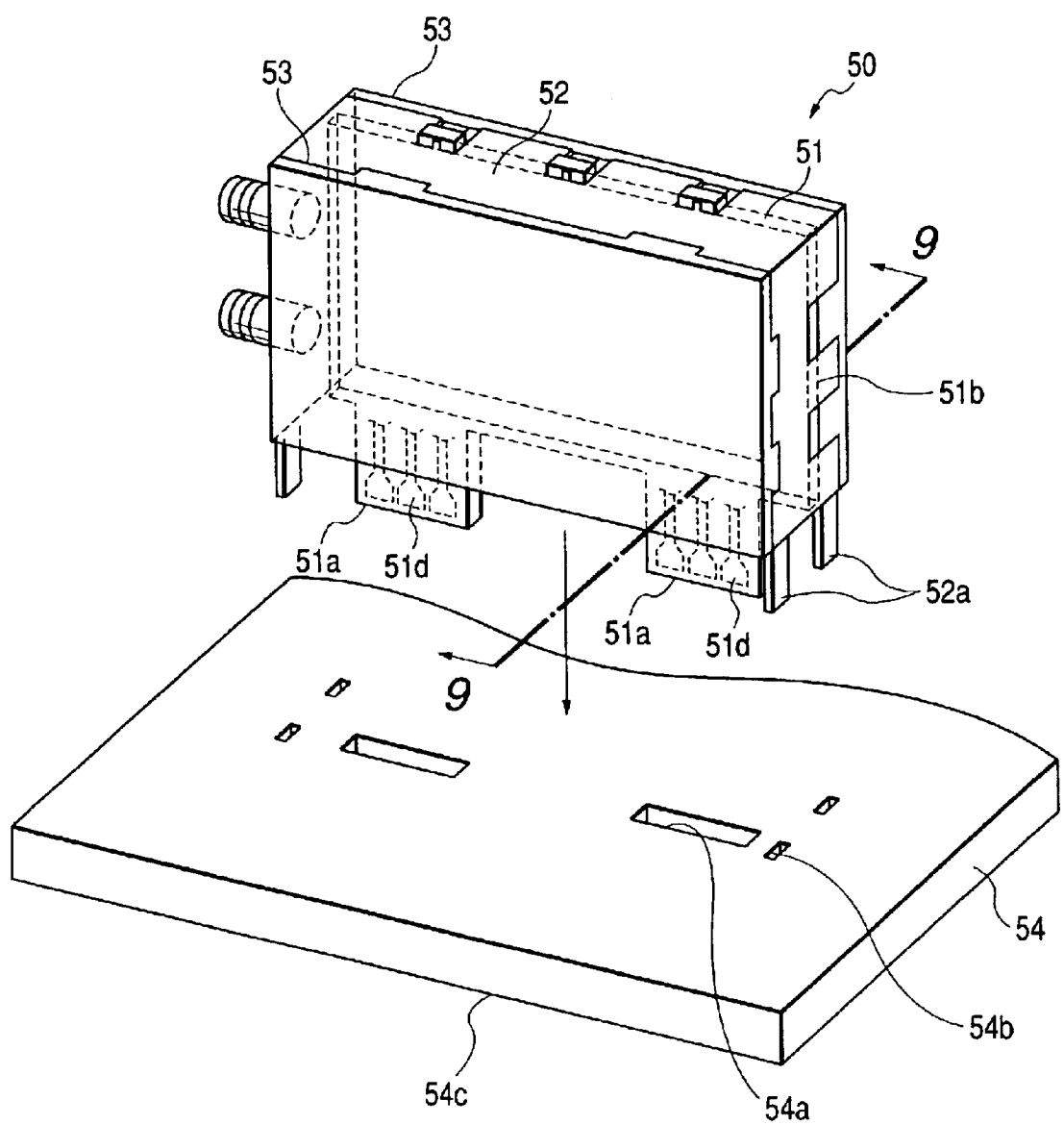
FIG. 8 is a perspective view illustrating a conventional structure for mounting an electronic circuit unit.
Figure 9:
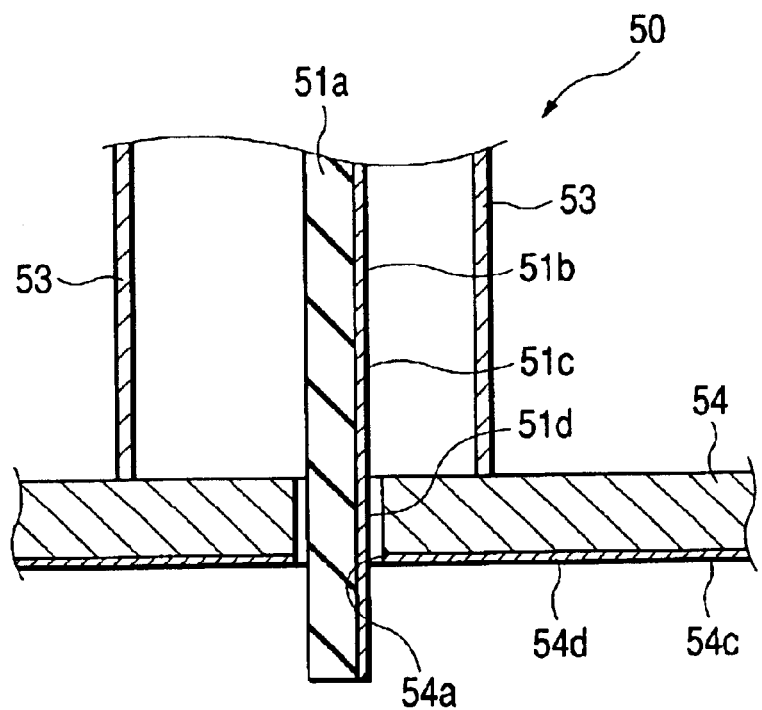
FIG. 9 is a sectional view illustrating a state where the conventional electronic circuit unit is mounted on a mother board along a line 9—9 in FIG. 8.

FIG. 6A is a sectional view illustrating a state where the protruded portion 3e has been inserted in the second through hole 5b, and FIG. 6B is a sectional view illustrating a state where the extending portions 3d have been inserted in the first through holes 5a. Further, FIG. 7 is a plan view illustrating a state where the extending portions 3d and the protruded portion 3e have been inserted in the first and second through holes 5a and 5b.

The protruded portion 3e and the extending portions 3d that are being inserted as shown in FIGS. 5A and 5B, are, then, completely inserted as the end of the housing 2 is brought into contact with the surface of the mother board 5 and as the housing 2 is placed on the mother board 5 as shown in FIGS. 6A and 6B.

At this moment, the protruded portion 3e receives a force in the direction B in FIG. 6A from the portion that is coming in contact with the wall of the second through hole 5b and, hence, the extending portions 3d provided continuous to the protruded portion 3e are pushed in the direction C in FIG. 6B in which the terminal patterns 8 are brought in contact with the wiring pattern 5e. As a result, as shown in FIG. 7, the circuit board 3 is mounted on the mother board 5 in a state where the terminal patterns 8 are firmly connected to the wiring pattern 5e.

According to the structure for mounting the electronic circuit unit 1 of the embodiment constituted as described above, the circuit board 3 is provided with the protruded portion 3e that works as pushing means separately from the extending portions 3d on which the terminal patterns 8 are formed, the extending portions 3d and the protruded portion 3e being formed of a piece of board, and the position of the second through hole 5b in which the protruded portion 3e is inserted being deviated from the positions of the first through holes 5a in which the extending portions 3d are inserted. Therefore, the protruded portion 3e is inserted at a position where it pushes the terminal patterns 8 onto the wiring pattern 5e. Due to the protruded portion 3e, therefore, the terminal patterns 8 on the extending portions 3d are reliably and strongly pushed onto the wiring pattern 5e on the mother board 5.

As a result, no gap develops between the terminal patterns 8 on the extending portions 3d and the wiring pattern 5e on the mother board 5. Accordingly, the electronic circuit unit 1 can be mounted on the mother board 5 highly precisely and easily without involving defective soldering, making it possible to improve the yield of mounting.

In this embodiment, the position of the second through hole 5b in which the protruded portion 3e is inserted is deviated from the positions of the first through holes 5a in which the extended portions 3d are inserted, so that the protruded portion 3e produces the pushing force. This invention, however, is in no way limited thereto only.

Concretely speaking, the following constitution, too, enables the protruded portion 3e to work as pushing means.

Namely, the first through holes 5a in which the extending portions 3d are inserted have a size with some degree of margin for smooth insertion of the extending portions 3d as contemplated in the same manner as in this embodiment, while the second through hole 5b is provided at such a position that brings the terminal patterns 8 on the extending portions 3d into reliable contact with the wiring pattern 5e, so that there exists almost no play in the size of the second through hole 5b in which the protruded portion 3e is to be inserted. Then, the protruded portion 3e is forcibly fitted into the second through hole 5b.

Here, the surface of the protruded portion 3e is better treated so as to withstand the friction due to forced insertion, e.g., is better coated with an insulating film.

According to this constitution, the protruded portion 3e is forcibly introduced into the through hole 5b of nearly the same size, and the terminal patterns 8 on the extending portions 3d are secured at positions where they are pushed onto the wiring pattern 5e on the mother board 5. Since the protruded portion 3e is secured onto the mother board 5, the circuit board 3 is correctly positioned and, hence, the terminal patterns 8 on the extending portions 3d are reliably and strongly pushed onto the wiring pattern 5e on the mother board 5.

According to the structure for mounting the electronic circuit unit of this invention as described above in detail, the circuit board is provided with pushing means for pushing the first wiring pattern on the circuit board onto the second wiring pattern on the mother board. This pushing means pushes the first wiring pattern onto the second wiring pattern, preventing the development of a gap between the first wiring pattern and the second wiring pattern. According to this invention, therefore, the first wiring pattern and the second wiring pattern are connected together without causing defective soldering, and there is provided the structure capable of highly precisely and easily mounting an electronic circuit unit on the mother board.

What is claimed is:

1. A structure for mounting an electronic circuit unit comprising:
    a circuit board provided, on one end side thereof, with extending portions having first wiring patterns formed on surfaces thereof;
    a housing that contains the circuit board while permitting the extending portions to protrude outward; and
    a mother board having, formed therein, through holes in which the extending portions are to be inserted, having, formed thereon, a second wiring pattern that is to be electrically connected to the first wiring patterns, and permitting the extending portions to be inserted in the through holes so that the housing is placed thereon;
    wherein the circuit board is provided with a protruded portion which extends separately from the extending portions on one end side, and laterally pushes the first wiring patterns onto the second wiring pattern.

2. A structure for mounting an electronic unit according to claim 1, wherein the mother board provides an insertion hole in which the protruded portion is to be inserted and by forcibly inserting the protruded portion in the insertion hole, the first wiring patterns on the extending portions are pushed onto the second wiring pattern.

3. A structure for mounting an electronic circuit unit according to claim 2, wherein the circuit board is provided with at least a pair of extending portions on one end side, a pair of through holes are formed in the mother board so as to be corresponded to the pair of extending portions, and the protruded portion is located midway between the pair of extending portions.

4. A structure for mounting an electronic circuit unit according to claim 2, wherein the insertion hole in which the protruded portion is to be inserted is formed at a position deviated in a direction in which the first wiring patterns are pushed onto the second wiring pattern from positions of the through holes in which the extending portions are to be inserted.

5. A structure for mounting an electronic circuit unit according to claim 2, wherein the protruded portion is tapered on a surface of a side opposite to a surface of a side on where the first wiring patterns of the circuit board are pushed onto the second wiring pattern.

* * * * *